(12) United States Patent
Matsumoto

(10) Patent No.: US 6,569,725 B1
(45) Date of Patent: May 27, 2003

(54) THIN FILM TRANSISTOR ARRAY AND METHOD FOR FABRICATING THE SAME

(75) Inventor: Seiichi Matsumoto, Tokyo (JP)

(73) Assignee: NEC Corporation, Tokyo (JP)

(*) Notice: Subject to any disclaimer, the term of this patent is extended or adjusted under 35 U.S.C. 154(b) by 134 days.

(21) Appl. No.: 09/722,738

(22) Filed: Nov. 28, 2000

Related U.S. Application Data

(62) Division of application No. 09/310,574, filed on May 12, 1999, now Pat. No. 6,211,534.

(30) Foreign Application Priority Data

May 14, 1998 (JP) ........................................ 1998-150592

(51) Int. Cl.[7] ........................... H01L 21/00; H01L 21/84
(52) U.S. Cl. ...................................... 438/161; 257/353
(58) Field of Search .................................. 438/149, 150, 438/161, 164, 158, 59, 160; 349/38; 257/72, 66, 67, 68

(56) References Cited

U.S. PATENT DOCUMENTS

| 5,670,795 A | * | 9/1997 | Ikeda ........................... 257/72 |
| 5,744,837 A | * | 4/1998 | Kamiura et al. ............. 257/355 |

FOREIGN PATENT DOCUMENTS

| JP | 3-296725 | | 12/1991 |
| JP | 5-67953 | | 9/1993 |
| JP | 08179366 A | * | 7/1996 |
| JP | 10-39329 | | 2/1998 |

* cited by examiner

*Primary Examiner*—Wael Fahmy
*Assistant Examiner*—Dana Farahani
(74) *Attorney, Agent, or Firm*—Foley & Lardner

(57) ABSTRACT

A TFT array for a liquid crystal display device in which inferiority due to electrification or abnormal discharge during fabrication process can be decreased. The TFT array comprises TFTs for display each connected to a respective one of pixel electrodes disposed in a matrix, gate wirings, signal lines, a common conductor line on the gate wiring side, a common conductor line on the signal line side, nonlinear elements respectively disposed between the gate wirings and the common conductor line on the gate wiring side and between the signal lines and the common conductor line on the signal line side. A gate electrode of a TFT in each of the nonlinear elements is formed separately from the corresponding common conductor line and is electrically coupled thereto via contact holes and a third conductor layer. A source/drain electrode of a TFT in each of the nonlinear elements is formed seprately from the corresponding common conductor line and is electrically coupled thereto via contact holes and the third conductor layer.

2 Claims, 15 Drawing Sheets

PRIOR ART

PRIOR ART

THIN FILM TRANSISTOR ARRAY AND METHOD FOR FABRICATING THE SAME

The above application is a Divisional application of Ser. No 09/310,574, filed May 12, 1999 now U.S. Pat. No. 6,211,534.

FIELD OF THE INVENTION

The present invention relates generally to a thin film transistor array and a method for fabricating the same. More particularly, the present invention relates to a thin film transistor array which is used, for example, in a liquid crystal display and the like and which is free from electrostatic damage during a manufacturing process thereof, and to a method for manufacturing such thin film transistor array.

BACKGROUND OF THE INVENTION

In the field of a thin film transistor array used, for example, in a liquid crystal display and the like, one of the most important problems to be solved is to decrease or avoid electrostatic damage, such as damage of conductors or insulating films and occurrence of abnormal characteristics of the thin film transistor (TFT), caused by electrification during a fabrication process of the TFT array or by abnormal discharge in a film forming apparatus and the like.

Conventionally, in order to avoid such disadvantage, all the gate wiring and signal lines coupled to the thin film transistor array are coupled to a common line via a resistor having low resistance. Thereby, potential of all the gate wirings and the signal lines is equalized, so that occurrence of the electrostatic damage can be decreased.

However, in this method, since all the gate wirings and signal lines have the same potential, it was impossible to perform an inspection for detecting defects of TFTs and the like after finishing a fabricating process thereof.

That is, in the inspection for detecting defects of the TFTs and the like, a predetermined potential voltage is applied sequentially to the gate wirings and the signal lines and each TFT for display is turned on, thereby an electric charge is stored in each of pixel electrodes of a liquid crystal display device. Then, a predetermined potential voltage is again sequentially applied to the gate wirings and the signal lines and each of the TFTs for display is turned off, so that electric charge stored in each of the pixel electrodes is hold for a predetermined time period. Thereafter, a predetermined potential voltage is again applied and each of the TFTs for display is turned on, thereby electric charge stored in each pixel electrode is leaked to the corresponding signal line. By measuring the quantity of the leaked electric charge, defect of the TFT for display, break or short circuit of wiring, and the like are detected.

However, in the above-mentioned conventional technique, since all the gate wirings and the signal lines are connected to a common line via a resistor having low resistance, current leakage occurs between the gate wirings and between the signal lines when, in the inspection for detecting defects, a predetermined voltage of several volts through several ten volts is sequentially applied to the gate wirings and the signal lines. Therefore, it was impossible to perform the inspection for detecting defects in the TFTs for display with high precision. To this end, a device having a thin film transistor array including one or more defective TFTs is sometimes passed to the next manufacturing process, and it was impossible to sufficiently reduce defective device.

In order to improve such disadvantage, Japanese patent laid-open publication No. 3-296725 and so on disclose a technique of forming nonlinear elements each comprising a pair of TFTs between a gate wiring and a common line on the gate wiring side and between a signal line and a common line on the signal line side.

In such prior art technique, the nonlinear elements are formed respectively between each of the gate wirings and the common line on the gate wiring side and between each of the signal lines and the common line on the signal line side. Therefore, in a manufacturing process after a process of forming TFTs, when a high potential voltage is applied to a particular gate wiring or signal line due to electrification and the like, the resistance of the nonlinear element connected to the gate wiring or the signal line becomes a relatively small value. Thus, it is possible to make a current caused by the high potential voltage escape into the common line on the gate wiring side or into the common line on the signal line side via the nonlinear elements. Also, when a relatively low voltage from several volts through several ten volts is applied to the gate wirings or the signal lines in the inspection for detecting defects of the TFTs for display, performed after finishing the TFT forming process, the nonlinear elements reveal a relatively large resistance of 1 giga-ohm or more. Therefore, current leak does not occur between the gate wirings or between the signal lines, and it is possible to perform the inspection for detecting defects of the TFTs for display in relatively high precision. Thus, taking the detected result of the inspection into consideration, it is possible to fix defects and to prevent defective thin film transistor arrays from passing into the next fabrication process.

During the fabricating process of the TFTs, however, there is a possibility of occurrence of a rush current and the like between the common line on the gate wiring side and the gate wiring, due to static electricity and the like. In such case, even when the above-mentioned technique is used, disadvantages occur, such as destruction of the gate wiring in which the rush current occurred, short circuit between the gate wiring and the common line due to the melting of the conductor film forming the gate wiring or the common line, or destruction of insulating film or occurrence of abnormal characteristic in the TFT for display connected to the wiring in which rush current flowed. These disadvantages can be detected in the inspection for detecting defects after finishing the fabrication process of the TFTs, but can cause some deterioration of production yield.

Explanation will be made on these disadvantages with reference to the drawings. FIG. 16 is a plan view showing a structure around a TFT for display 18 and around a nonlinear element 51 formed between a gate wiring 13 and a common line on the gate wiring side 56 of a conventional thin film transistor array. FIG. 17 is a cross sectional view taken along the line E-E of FIG. 16. FIG. 18 is a circuit diagram showing an equivalent circuit of the nonlinear element 51 shown in FIG. 16. FIG. 19 is a plan view showing a structure during a process of forming the TFT array shown in FIG. 16, after the completion of a semiconductor film.

As shown in FIGS. 16, 17 and 19, the common line on the gate wiring side 56 and the gate wiring 13 are close to each other at an area between a gate electrode portion 50 and a gate electrode portion 49 of a nonlinear element 51 which portions are integrally formed with the common line on the gate wiring side 56 and the gate wiring 13, respectively. The distance between the gate electrode portions 50 and 49 are approximately several micrometers (microns) through several tens micrometers. Therefore, during a halfway process before finishing a fabrication process of TFTs, when a high potential voltage is applied to a particular gate wiring 13, due to electrification or abnormal discharge and the like, and a voltage difference between the common line on the gate wiring side 56 and the gate wiring 13 becomes large, there often occurs a condition in which the voltage difference exceeds the withstand voltage between the common line 56 and the gate wiring 13. Therefore, a rush current flows between the gate electrodes 49 and 50 of the nonlinear element 51.

Especially, the above-mentioned disadvantages such as the electrification, the abnormal discharge and the like often occur in a process in which a device to be fabricated is exposed to a plasma for a relatively long time, for example, in a film forming process using CVD method, a dry etching process, and the like. Therefore, in the conventional thin film transistor array, it was difficult to decrease an electrostatic damage, such as damage of wirings or insulating films, which occurs in a halfway process before the completion of a TFT fabricating process, for example, in a process of forming a film such as a gate insulating film or a semiconductor film or in the dry etching process.

Also, the common line on the gate wiring side 56 is formed outside a region where the TFTs for display are disposed, that is, on the edge portion of an insulating substrate. Therefore, the common line on the gate wiring side 56 tends to receive electrostatic voltage by the contact with various apparatuses and the like used in the fabrication process of the TFT and to receive electrical discharge from such apparatuses.

Further, since the common line on the gate wiring side 56 and the gate wiring 13 extend in a relation at right angles to each other, the common line on the gate wiring side 56 is close to all the several hundred through more than a thousand of the gate wirings 13. When the potential difference between a particular gate wiring and the common line on the gate wiring side 56 exceeds the withstand voltage therebetween due to electrification, abnormal discharge and the like and thereby the rush current occurs, potential of the common line on the gate wiring side 56 also changes abruptly. To this end, the rush current also occurs at one or more portions having relatively low withstand voltages between the common line on the gate wiring side 56 and the gate wirings 13, among several hundred through more than a thousand of gate wirings 13 which exist near the common line on the gate wiring side 56. Therefore, electrostatic damage may occur in many portions. The above-mentioned disadvantages also occur with respect to the signal lines and the common line on the signal line side.

SUMMARY OF THE INVENTION

Considering the above-mentioned problems, the present invention has been made. It is a main object of the present invention to provide a thin film transistor array in which discharge between gate wirings and a common line on the gate wiring side and between signal lines and a common line on the signal line side caused by electrification, abnormal discharge and the like can be decreased.

It is another object of the present invention to provide a thin film transistor array in which occurrence of a rush current during a manufacturing process thereof can be suppressed.

It is still another object of the present invention to provide a thin film transistor array in which occurrence of electrostatic damage can be suppressed.

It is still another object of the present invention to provide a thin film transistor array in which damage of wirings and insulating films and occurrence of inferior characteristic of TFTs for display caused by electrification or abnormal discharge during a manufacturing process can be decreased.

According to an aspect of the present invention, there is provided a

According to another aspect of the present invention, there is provided a

BRIEF DESCRIPTION OF THE DRAWINGS

These and other features, and advantages, of the present invention will be more clearly understood from the following detailed description taken in conjunction with the accompanying drawings, in which like reference numerals designate identical or corresponding parts throughout the figures, and in which.

DESCRIPTION OF A PREFERRED EMBODIMENT

With reference to the drawings, preferred embodiments of the present invention will now be described in detail.

Figure 1:
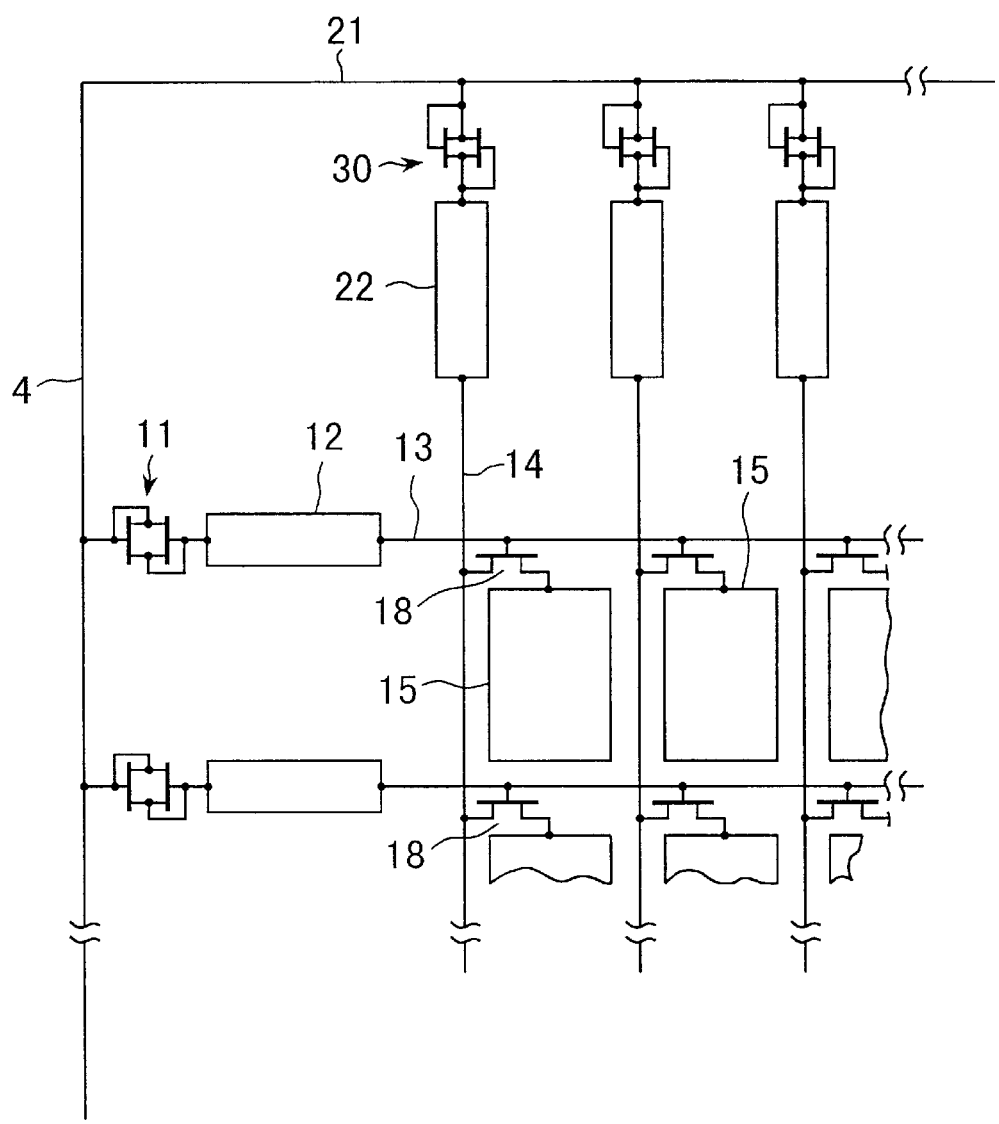
FIG. 1 is a partial schematic circuit diagram showing a circuit of a liquid crystal display device including a thin film transistor (TFT) array according to the present invention.

FIG. 1 is a partial schematic circuit diagram showing an equivalent circuit of a liquid crystal display device including a TFT array according to the present invention. The circuit of FIG. 1 comprises a plurality of transparent pixel electrodes 15 disposed in a matrix having rows and columns, and a plurality of TFTs 18 for display each connected to a corresponding one of the pixel electrodes 15, both formed on the substrate which is not shown and which is made of transparent and insulating material such as glass and the like. On the substrate are also formed a plurality of gate lines or gate wirings 13 each of which is provided for every row of the pixel electrodes 15 to supply a gate signal to the TFTs for display 18 in a corresponding row, and a plurality of signal lines 14 each of which is provided for every column of the pixel electrodes 15 to supply a data signal to the TFTs for display 18 in a corresponding column.

In addition to the above-mentioned components, at a portion near one end of each of the gate wirings 13, a gate terminal 12, which is used for inputting a predetermined signal from an external circuit, is formed integrally with the corresponding gate wiring 13. Also, at a portion near one end of each of the signal line 14, a signal terminal 22, which is used for inputting a predetermined signal from an external circuit, is formed integrally with the corresponding signal line 14. Further, one end of each of the gate terminals 12 is connected, via a nonlinear element 11 comprising a pair of TFTs, to a common conductor line or common line on the gate wiring side 4, and one end of each of the signal terminals 22 is connected, via a nonlinear element 30 comprising a pair of TFTs, to a common conductor line or common line on the signal line side 21.

The common line on the gate wiring side 4 including the nonlinear elements 11 and the common line on the signal line side 21 including the nonlinear elements 30 can be both disconnected and removed from the liquid crystal display device at the final stage of manufacturing process of the device.

A first embodiment of the present invention concerns what is called a bottom gate type TFT wherein a gate electrode, a gate insulating film, a semiconductor film or layer, and source/drain electrodes are formed in this order from the bottom to the top on a substrate. A second embodiment concerns what is called a top gate type TFT wherein source/drain electrodes, a semiconductor film or layer, a gate insulating film, and a gate electrode are formed in this order from the bottom to the top on a substrate.

(First Embodiment)

Figure 2:
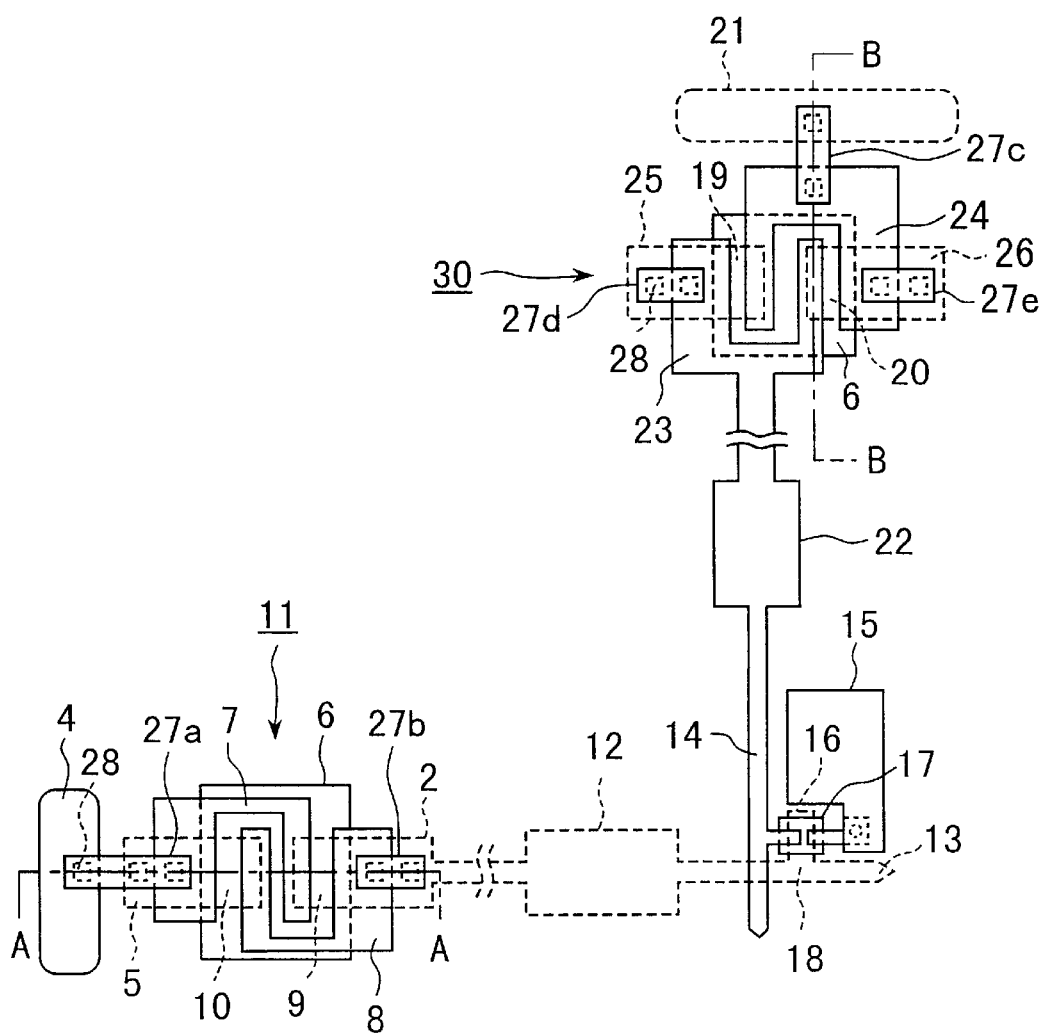
FIG. 2 is a partial plan view illustrating a structure of a TFT array according to a first embodiment of the present invention.
Figure 3:
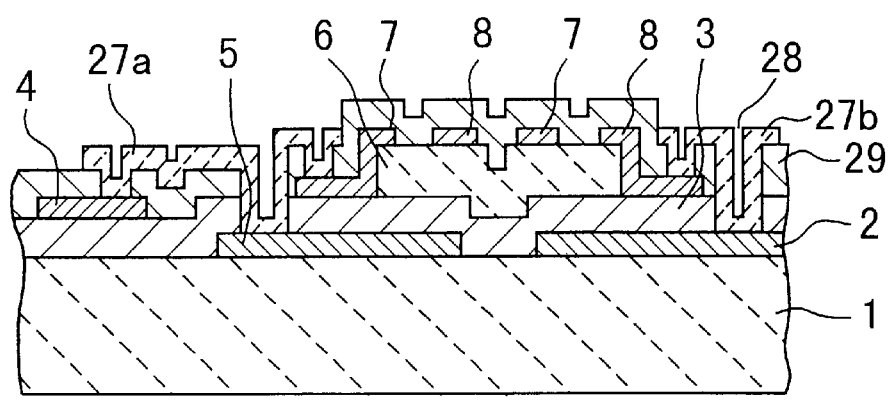
FIG. 3 is a partial sectional view of the TFT array according to the first embodiment of the present invention taken along the line A—A of FIG. 1.
Figure 4:
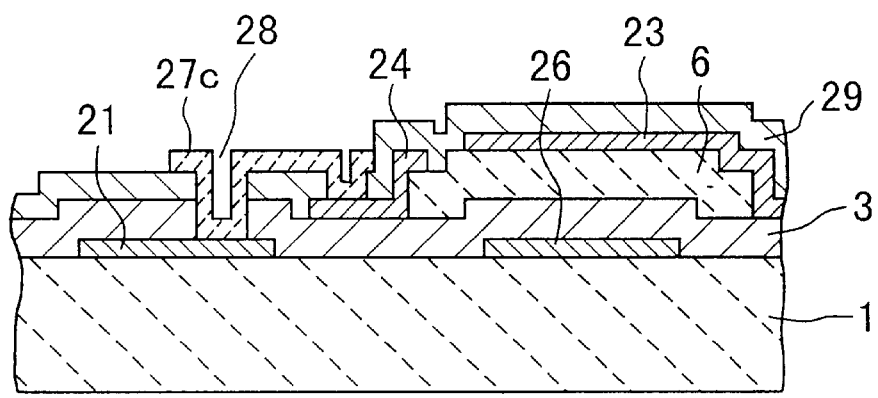
FIG. 4 is a partial sectional view of the TFT array according to the first embodiment of the present invention taken along the line B—B of FIG. 1.
Figure 5:
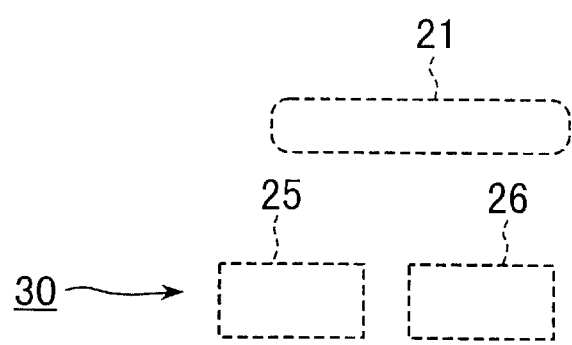
FIG. 5 is a partial plan view illustrating a structure during a process for fabricating the TFT array according to the first embodiment of the present invention.
Figure 5:
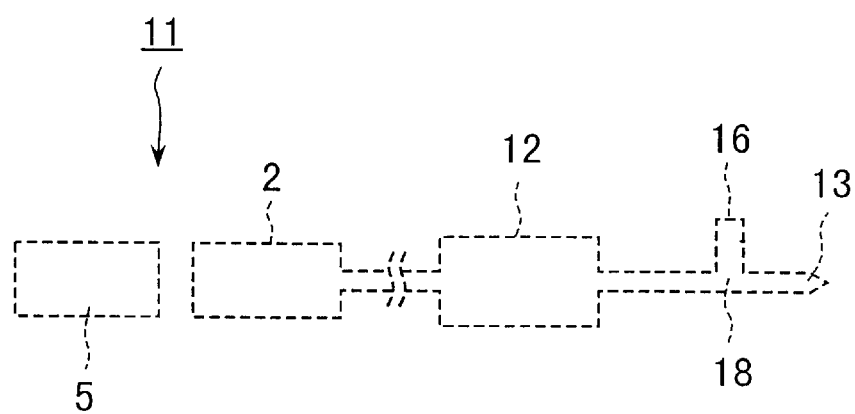
Figure 6:
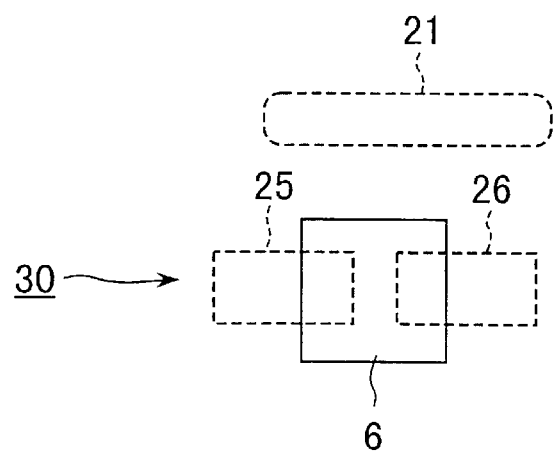
FIG. 6 is a partial plan view illustrating a structure during a process for fabricating the TFT array according to the first embodiment of the present invention.
Figure 6:
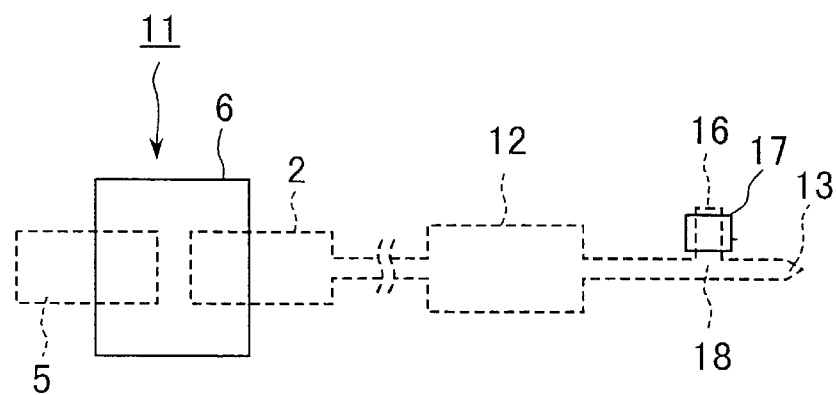
Figure 7:
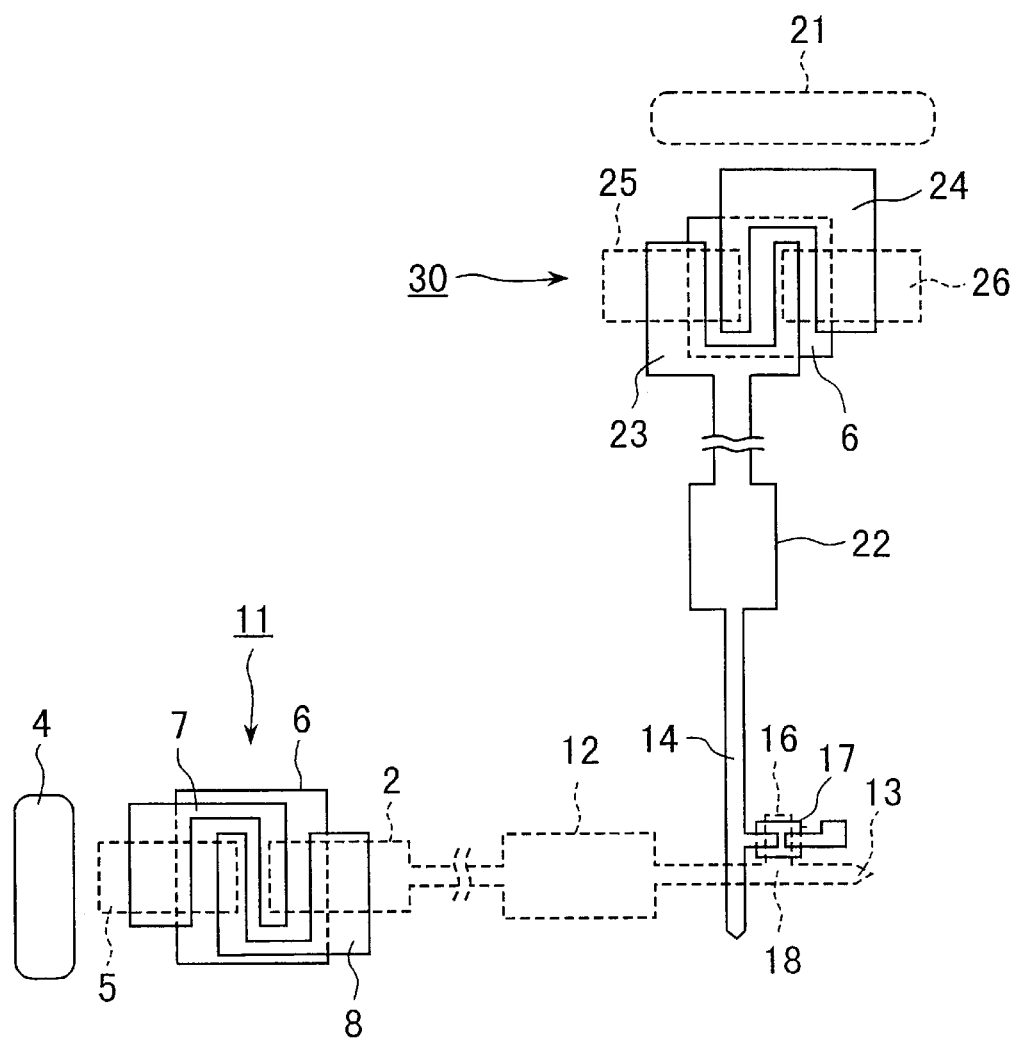
FIG. 7 is a partial plan view illustrating a structure during a process for fabricating the TFT array according to the first embodiment of the present invention.
Figure 8:
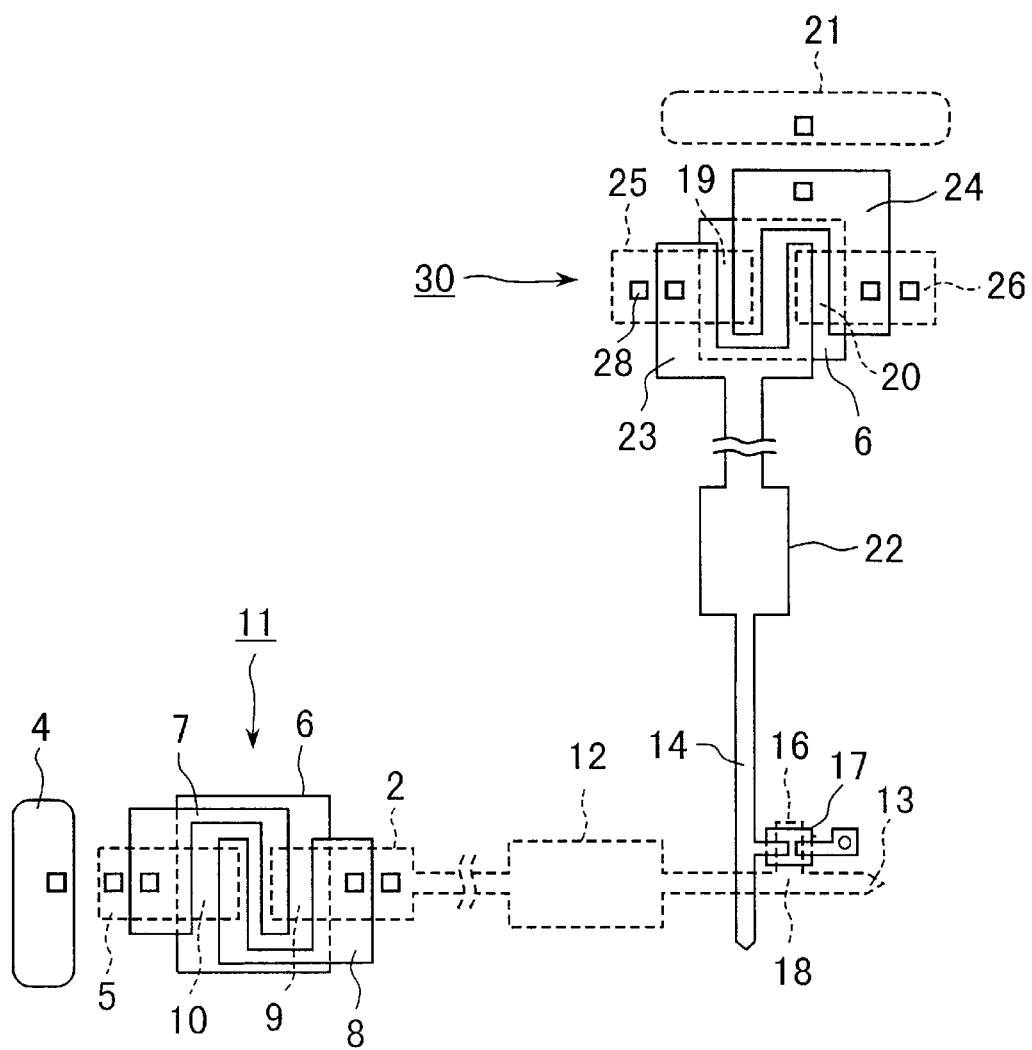
FIG. 8 is a partial plan view illustrating a structure during a process for fabricating the TFT array according to the first embodiment of the present invention.

The first embodiment of the present invention will be described with reference to FIG. 2 through FIG. 8. FIG. 2 is a plan view showing a part of a thin film transistor (TFT) array according to the first embodiment of the present invention. In FIG. 2, a structure around a nonlinear element 11 comprising a pair of TFTs 9 and 10 formed at an end portion of a gate wiring 13, around a nonlinear element 30 comprising a pair of TFTs 19 and 20 formed at an end of a signal line 14, and around a TFT for display 18 is illustrated. FIG. 3 is a cross sectional view taken along the line A—A of FIG. 2, and FIG. 4 is a cross sectional view taken along the line B—B of FIG. 2. FIG. 5 through FIG. 8 are plan views showing structures of the thin film transistor of FIG. 2 sequentially in various steps of fabricating process thereof. In particular, FIG. 5 is a plan view showing a structure after patterning of a first conductor film or layer is completed. FIG. 6 is a plan view showing a structure after patterning of a semiconductor film or layer to form semiconductor film regions 6 and 17 is completed. FIG. 7 is a plan view showing a structure after patterning of a second conductor layer is completed. FIG. 8 is a plan view showing a structure after formation of contact holes 28 is finished. Also, the structure shown in the above-mentioned FIG. 2 corresponds to the structure after patterning of a third conductor film is completed.

From FIG. 2, it is apparent that the first embodiment of the present invention has at least two characteristic structures mentioned below.

The first characteristic structure is that, among a pair of TFTs 9 and 10 forming the nonlinear element 11 between the gate wiring 13 and the common line on the gate wiring side 4, a gate electrode 5 of the TFT 10 on the side of the common line on the gate wiring side 4 is formed as an island like conductor, i.e., as a conductor region isolated from other conductors, that the common line on the gate wiring side 4 is formed by the second conductor film or layer, and that the gate electrode 5 and the common line on the gate wiring side 4 are electrically connected by using a coupling conductor portion 27a formed by a third conductor film or layer 27 via contact holes 28 formed at predetermined connecting portions.

The second characteristic structure is that, among a pair of TFTs 19 and 20 forming the nonlinear element 30 between the signal line 14 and the common line on the signal line side 21, a source/drain electrode 24 of the TFT 20 on the side of the common line on the signal line side 21 is formed as an island like conductor, that the common line on the signal line side 21 is formed by the first conductor film or layer, and that the source/drain electrode 24 and the common line on the signal line side 21 are electrically connected by using a coupling conductor portion 27c formed by the third conductor film 27 via contact holes 28 formed at predetermined connecting portions.

With reference to FIGS. 2–8, a method for fabricating the thin film transistor array according to the first embodiment will how be explained.

First, the first conductor film is formed on a substrate 1 made of transparent and insulating material, for example, glass and the like by using sputtering and the like. Then, as shown in FIG. 5, the first conductor film is patterned by using photolithography to form the gate wiring 13, a gate terminal 12, a gate electrode 16 of a TFT for display 18, gate electrodes 2 and 5 of the nonlinear element 11, gate electrodes 25 and 26 of the nonlinear element 30, and the common line on the signal line side 21, each having a predetermined pattern. In this case, the gate electrode 5 of the nonlinear element 11 is electrically isolated from other electrodes and wirings made of the first conductor film. The gate electrode 2 of the nonlinear element 11, the gate terminal 12, the gate electrode 16 of the TFT for display, and the gate wiring 13 are all electrically connected. Also, the gate electrodes 25 and 26 of the nonlinear element 30 and the common line on the signal line side 21 are electrically isolated from each other.

Then, an insulating film or layer 3 is formed on whole surface of the substrate 1, and a semiconductor film or layer is formed on the insulating film 3. The semiconductor film is then patterned by using photolithography to form a semiconductor film regions 6 and 17 as shown in FIG. 6.

Thereafter, the second conductor film is formed on whole surface of the substrate 1. The second conductor film is patterned by using photolithography to form, as shown in FIG. 7, the signal line 14, the signal terminal 22, the common line on the gate wiring side 4, source/drain electrodes 7 and 8 of the nonlinear element 11, source/drain electrodes of the TFT for display 18, and source/drain electrodes 23 and 24 of the nonlinear element 30, each having a predetermined pattern. In this case, the signal line 14, one of the source/drain electrode of the TFT for display 18, the signal terminal 22, and the source/drain electrode 23 of the nonlinear element 30 are all electrically connected. Other electrodes and wirings formed by the second conductor film are electrically isolated from each other and from the signal line 14 and the like.

In the next process, a protecting film 29 made of an insulating material is formed on whole surface of the substrate 1. Thereafter, by using photolithography, contact holes 28 are formed at predetermined portions of the protecting film 29 and the insulating film 3 on the first conductor film and the second conductor film, as shown in FIG. 8. Next, the third conductor film is formed on whole surface of the substrate 1. Then, the third conductor film is patterned by using photolithography such that, as shown in FIG. 2, coupling conductor portions 27a, 27b, 27c, 27d and 27e are formed and such that predetermined portions of the first conductor film and the second conductor film are mutually connected via the contact holes 28. In this case, each of pixel electrodes 15 having a predetermined pattern is also formed.

After the above-mentioned processes are performed, a plurality of transparent pixel electrodes 15 disposed in a matrix, and a plurality of TFTs for display 18 each connected to one of the pixel electrodes 15 are formed on the substrate 1 which is made of transparent and insulating material such as glass and the like. On the substrate 1 are also formed a plurality of gate wirings 13 which are formed of the first conductor film and each of which is provided for every row of the pixel electrodes 15 to supply a gate signal to the TFTs for display 18 in a corresponding row, and a plurality of signal lines 14 which are formed of the second conductor film and each of which is provided for every column of the pixel electrodes 15 to supply a data signal to the TFTs for display 18 in a corresponding column.

In addition to the above-mentioned components, at a portion near one end of each of the gate wirings 13, the gate terminal 12, which is used for inputting a predetermined signal from an external circuit, is formed integrally with the corresponding gate wiring 13. Also, at a portion near one end of each of the signal line 14, the signal terminal 22, which is used for inputting a predetermined signal from an external circuit, is formed integrally with the corresponding signal line 14. Further, one end of each of the gate terminals 12 is connected via the nonlinear element 11 comprising a pair of TFTs to the common line on the gate wiring side 4, and one end of each of the signal terminals 22 is connected via the nonlinear element 30 comprising a pair of TFTs to the common line on the signal line side 21.

Figure 18:
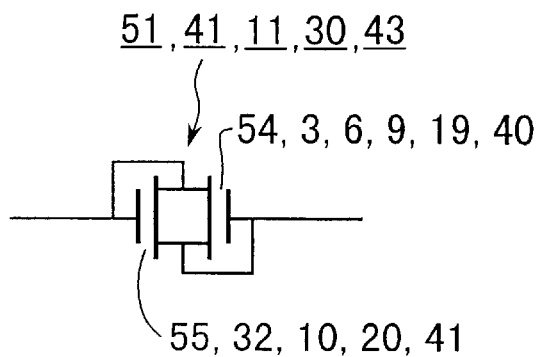
FIG. 18 is a circuit diagram showing an equivalent circuit of a nonlinear element.

As shown in the equivalent circuit of FIG. 18, the nonlinear element 11 is electrically equivalent to a circuit formed by two TFTs 9 and 10, wherein gate electrode and drain electrode of each TFT are mutually connected, and wherein source electrode and drain electrode of one of the two TFTs are respectively connected to drain electrode and source electrode of the other one of the two TFTs. Also, the nonlinear element 30 is electrically equivalent to a circuit formed by two TFTs 19 and 20, wherein gate electrode and drain electrode of each TFT are mutually connected, and wherein source electrode and drain electrode of one of the two TFTs are respectively connected to drain electrode and source electrode of the other one of the two TFTs.

In the above-mentioned first embodiment, among a pair of TFTs 9 and 10 forming the nonlinear element 11, the gate electrode 5 of the TFT 10 on the side of the common line on the gate wiring side 4, is formed as an island like conductor, and the common line on the gate wiring side 4 is formed by the second conductor layer. Therefore, differing from the conventional thin film transistor array, during a process of forming the TFT array and before the completion of formation of the third conductor film 27, conductor patterns do not exist which are connected to the common line on the gate wiring side 4 disposed perpendicular to the gate wirings 13 and which are adjacent one ends of the gate wirings 13 in the vicinity of the nonlinear element 11.

Also, among a pair of TFTs 19 and 20 forming the nonlinear element 30, the source/drain electrode 24 of the TFT 20 on the side of the common line on the signal line side 21, is formed as an island like conductor, and the common line on the signal line side 21 is formed by the first conductor layer. Therefore, during a process of forming the TFT array and before the completion of formation of the third conductor film 27, conductor patterns do not exist which are connected to the common line on the signal line side 21 disposed perpendicular to the signal lines 14 and which are adjacent one ends of the signal lines 14 in the vicinity of the nonlinear element 30.

Therefore, even when a high potential voltage is applied to a particular gate wiring 13 or the common line on the gate wiring side 4 due to electrification or abnormal discharge during a process of fabricating the TFT array, occurrence of a rush current between the gate wiring 13 and the common line on the gate wiring side 4 can be avoided. Consequently, disadvantages, such as destruction of the gate wiring 13 or gate insulating film 3, occurrence of abnormal characteristic of the TFT for display 18 connected to the gate wiring 13 and the like, caused by such rush current can be decreased. Similarly, even when a high potential voltage is applied to a particular signal line 14 or the common line on the signal line side 21 due to electrification or abnormal discharge during a process of fabricating the TFT array, occurrence of a rush current between the signal line 14 and the common line on the signal line side 21 can be avoided. Consequently, disadvantages, such as destruction of the signal line 14 or gate insulating film 3, occurrence of abnormal characteristic of the TFT for display 18 connected to the signal line 14 and the like, caused by such rush current can be decreased.

With reference to FIG. 2 and FIGS. 5—8 showing process steps of forming the TFT array, the above-mentioned advantages will now be explained in further detail.

With respect to the vicinity of the nonlinear element 11, from the time patterning of the first conductor film is completed as shown in FIG. 5 to the time patterning of the semiconductor layer is completed to form the semiconductor film regions 6 and 17 as shown in FIG. 6, conductor patterns formed by the first conductor layer existing in the vicinity of the nonlinear element 11 are only as follows. That are, the gate wiring 13, the gate terminal 12 integrally formed with the gate wiring 13, the gate electrode 2 of the TFT 9 among a pair of TFTs 9 and 10 forming the nonlinear element 11, and the gate electrode 5 of the other TFT 10 which gate electrode 5 is formed at a predetermined space distance from the gate electrode 2 and which gate electrode 5 is formed as an island like region, i.e., as an isolated conductor region.

Figure 19:
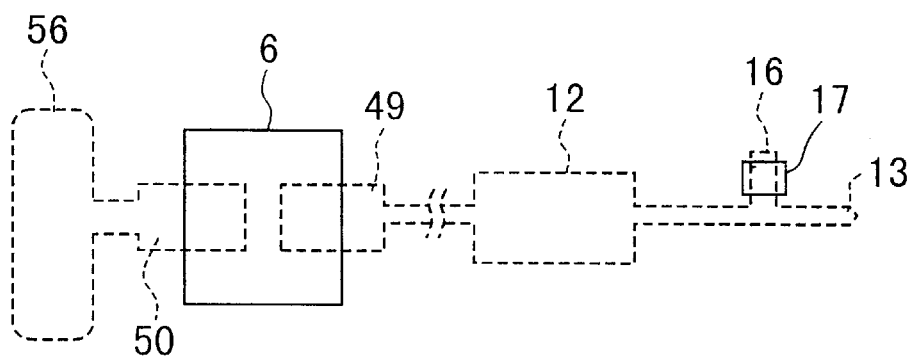
FIG. 19 is a partial plan view illustrating a structure during a process for fabricating the conventional TFT array.

That is, in the TFT array according to the present invention, a common line which is formed by the first conductor layer and which extends adjacently to and at right angles with the gate wirings 13 like that of the prior art (see FIG. 19) does not exist. Therefore, even when a high potential voltage is applied to a particular gate wiring 13, due to the electrification or abnormal discharge during the process of fabricating the TFTs, no rush current occurs from the gate wiring 13 to the common line on the gate wiring side 4. Also, even if a rush current has occurred between a particular gate wiring 13 and a gate electrode 5 formed as an island like region, the rush current does not cause a rush current in other gate wirings via the common line on the gate wiring side 4. Thus, according to the present invention, it is possible to prevent the influence of electrostatic damage from extending to other gate wirings.

Also, from the time patterning of the second conductor film is completed as shown in FIG. 7 to the time formation of the contact holes 28 is completed as shown in FIG. 8, the gate electrode 5 of the TFT 10 among two TFTs forming the nonlinear element 11 is formed as an island like region and is not yet electrically connected to the common line on the gate wiring side 4. Thus, the common line on the gate wiring side 4 and the gate electrodes 2 which are integrally formed with the respective gate wirings 13 are not adjacent to each other. Therefore, even when a high potential voltage is applied to a particular gate wiring 13, due to the electrification or abnormal discharge during the process of fabricating the TFTs, no rush current occurs between the gate wiring 13 and the common line on the gate wiring side 4.

With respect to the vicinity of the nonlinear element 30, from the time patterning of the second conductor film is completed as shown in FIG. 7 to the time formation of the contact holes 28 is completed as shown in FIG. 8, the source/drain electrode 24 of the TFT 20 among two TFTs forming the nonlinear element 30 is formed as an island like region and is not yet electrically connected to the common line on the signal line side 21. Thus, the common line on the signal line side 21 and the source/drain electrodes 23 which are integrally formed with the respective signal lines 22 are not adjacent to each other. Therefore, even when a high potential voltage is applied to a particular signal line 14, due to the electrification or abnormal discharge during the process of fabricating the TFTs, no rush current occurs between the signal line 14 and the common line on the signal line side 21.

Especially, in a halfway process until the formation of the TFTs is completed, electrification or abnormal discharge often occurs in processes during which the substrate, on which the TFT array is formed, is exposed to a plasma for a relatively long time, for example, in a film forming process of a gate insulating film or of a semiconductor film by using a CVD method, a dry etching process of a semiconductor film or of a gate insulating film, and the like. In the TFT array according to this embodiment, the gate wirings 13 and the common line on the gate wiring side 4, and the signal lines 14 and the common line on the signal line side 21 can be fabricated without bringing them into close locations, during the above-mentioned processes in which electrification or abnormal discharge often occurs, and, therefore, occurrence of the electrostatic damage can be greatly decreased.

After the formation of the TFT array is completed, resistance of each of the nonlinear elements 11 and 30 becomes equal to or greater than 1 giga-ohm when the voltage applied between both terminals thereof is equal to or smaller than 30 volts, and becomes a small value which is considerably smaller than 1 giga-ohm when the voltage applied between both terminals thereof is equal to or larger than 60 volts. To this end, when a high potential voltage is applied to a particular gate wiring 13 or signal line 14 due to electrification and the like, a current caused by the high potential voltage can escape from the gate wiring 13 or the signal line 14 to the common line on the gate wiring side 4 or the common line on the signal line side 21 via the nonlinear elements 11 or 30, respectively. Therefore, occurrence of defects such as the destruction of the gate wiring 13 or the signal line 14 to which the high potential voltage is applied or abnormal characteristic of the TFT for display 18 can be decreased.

Further, in the test for detecting defects of the TFT array and the like performed after the completion of the fabrication process of the TFTs, when a predetermined voltage, for example, several volts through approximately 20 volts, is applied to the gate wirings 13 and the signal lines 14, the resistance of each of the nonlinear elements 11 and 30 becomes very large. Therefore, leak current flowing through each of the nonlinear elements 11 and 30 becomes very small, so that the test for detecting defects can be done precisely.

(Second Embodiment)

Figure 9:
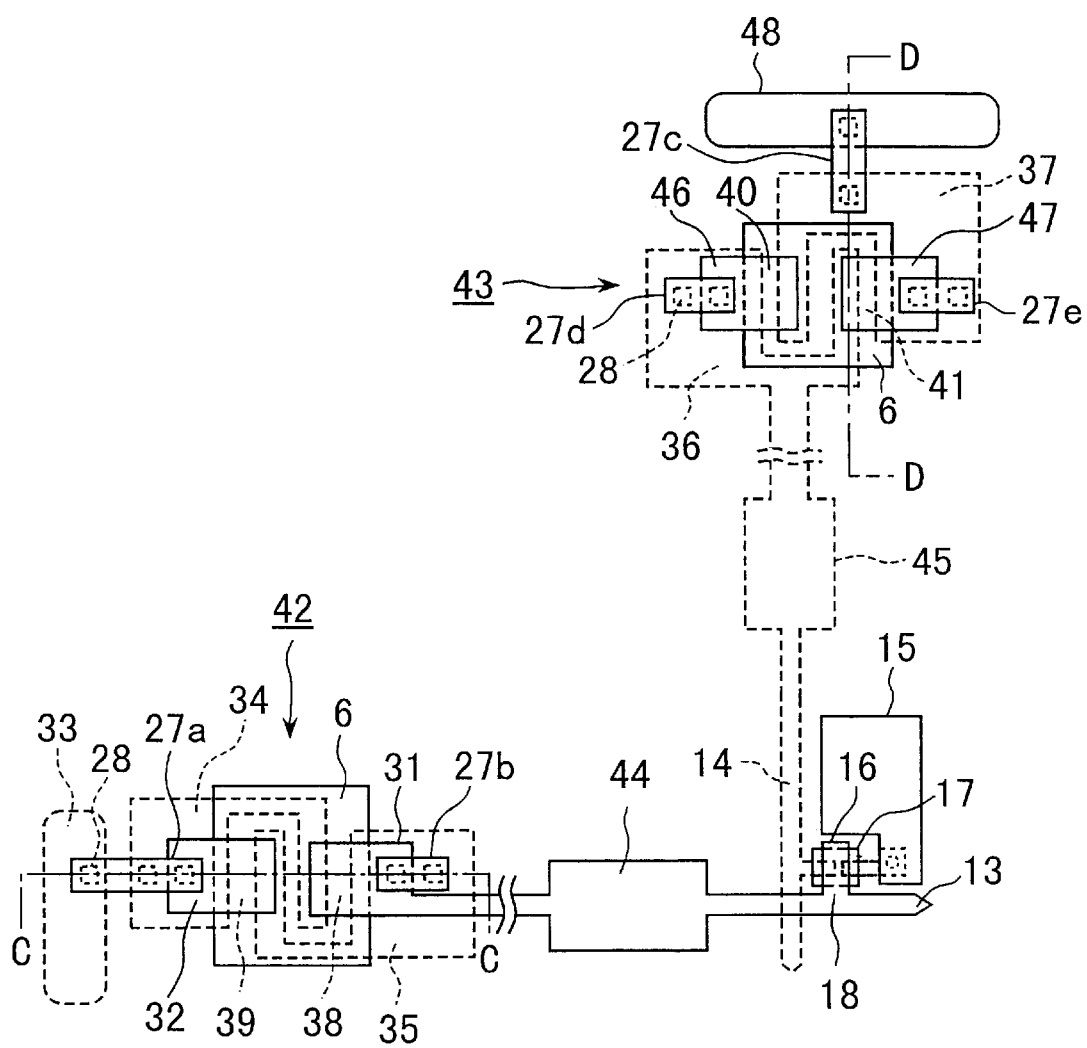
FIG. 9 is a partial plan view illustrating a structure of a TFT array according to a second embodiment of the present invention.
Figure 10:
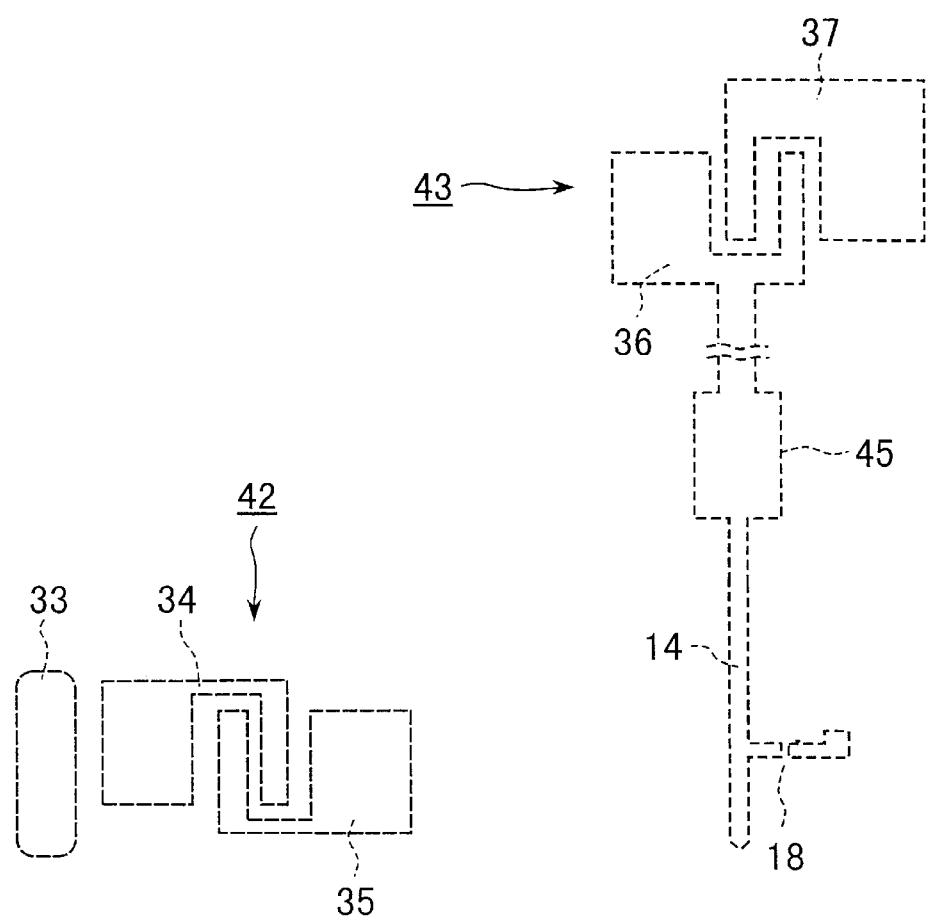
FIG. 10 is a partial plan view illustrating a structure during a process for fabricating the TFT array according to the second embodiment of the present invention.
Figure 11:
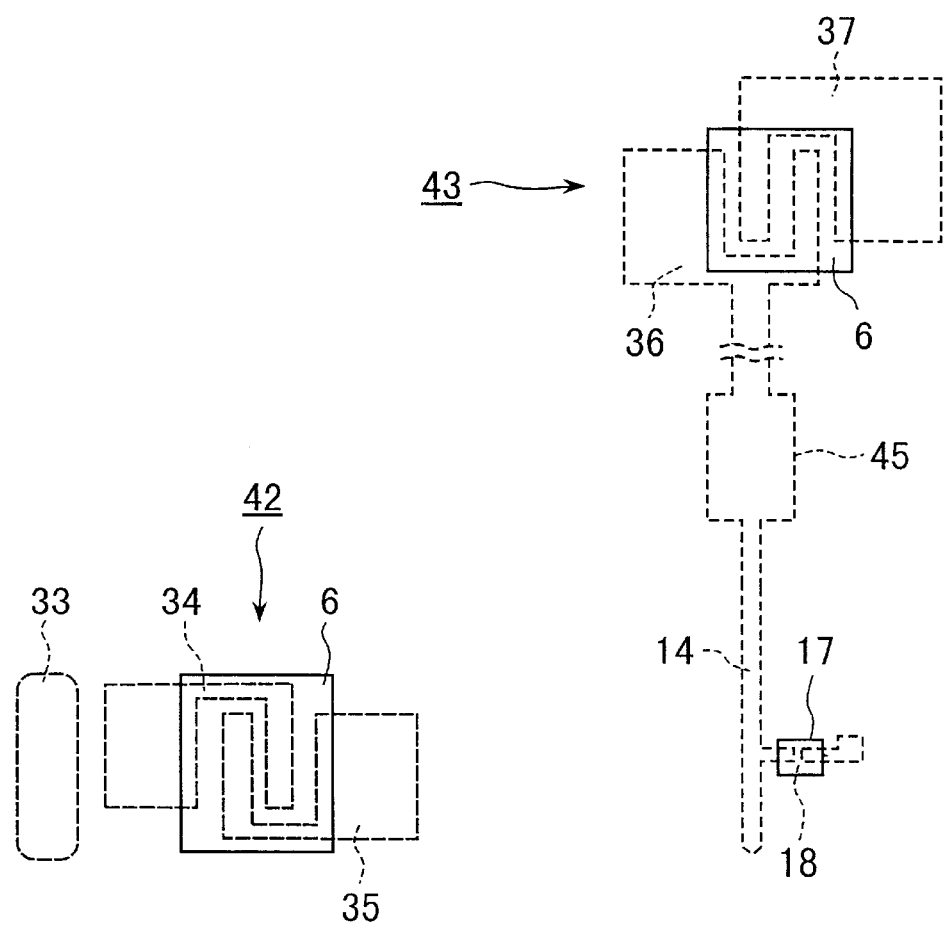
FIG. 11 is a partial plan view illustrating a structure during a process for fabricating the TFT array according to the second embodiment of the present invention.
Figure 12:
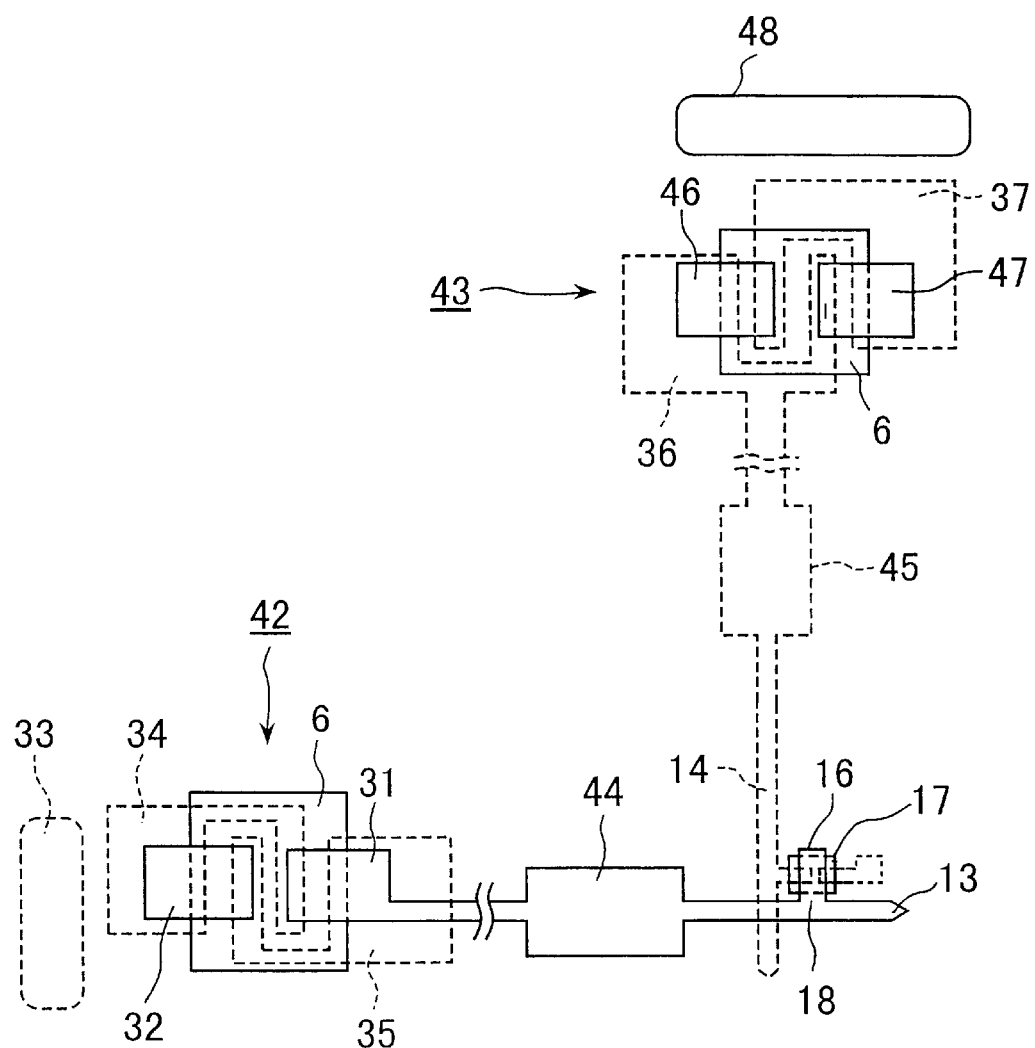
FIG. 12 is a partial plan view illustrating a structure during a process for fabricating the TFT array according to the second embodiment of the present invention.
Figure 13:
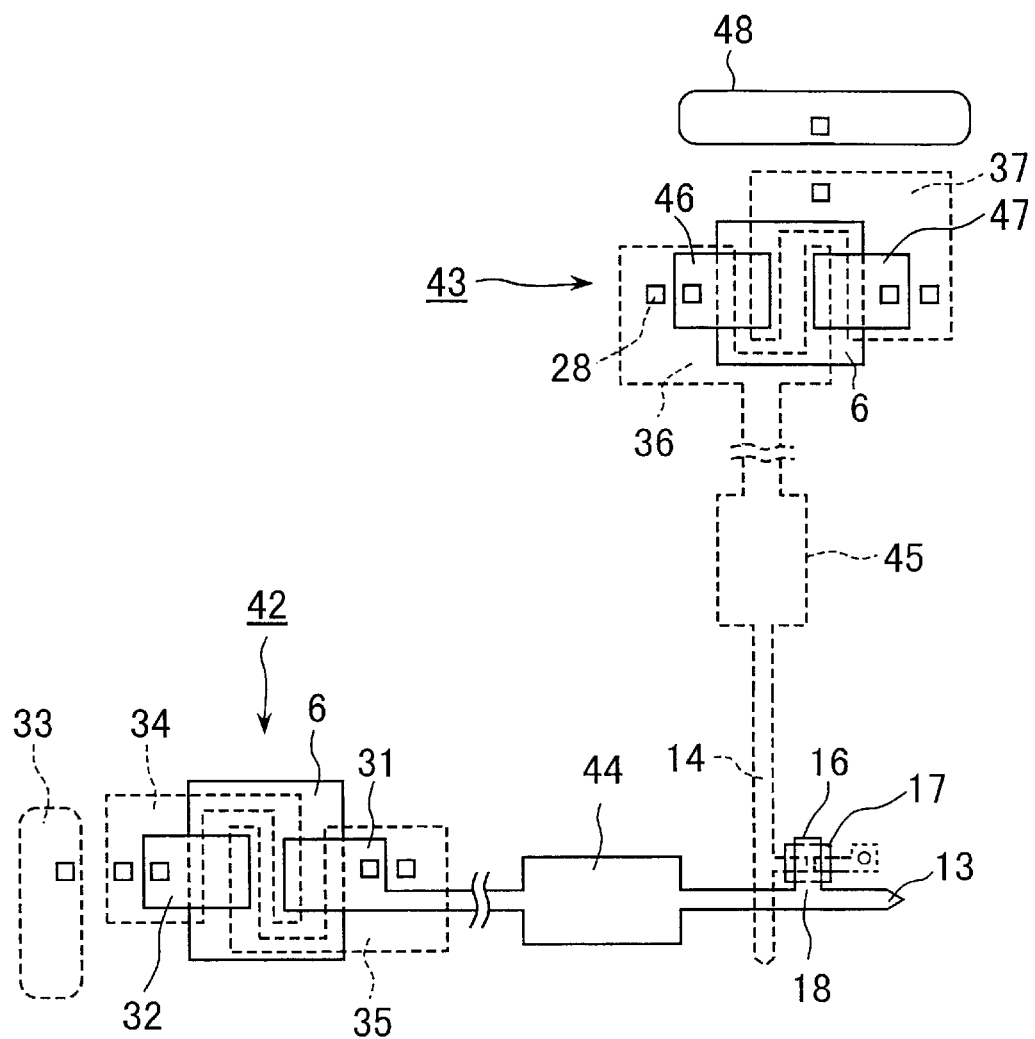
FIG. 13 is a partial plan view illustrating a structure during a process for fabricating the TFT array according to the second embodiment of the present invention.
Figure 14:
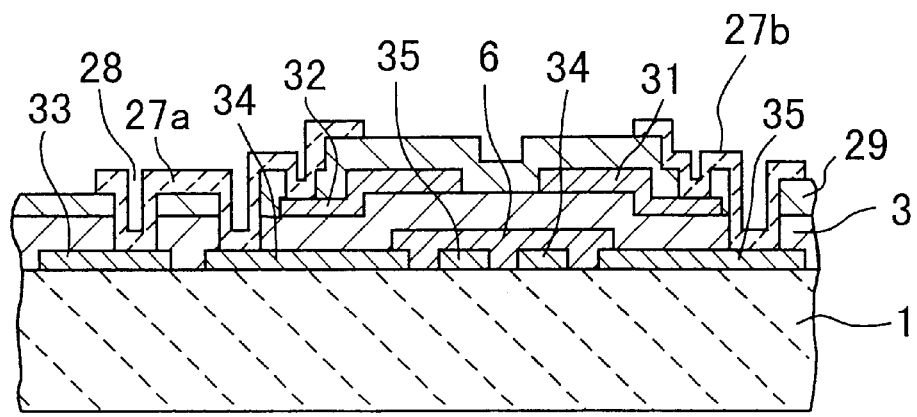
FIG. 14 is a partial sectional view of the TFT array according to the second embodiment of the present invention taken along the line C—C of FIG. 9.
Figure 15:
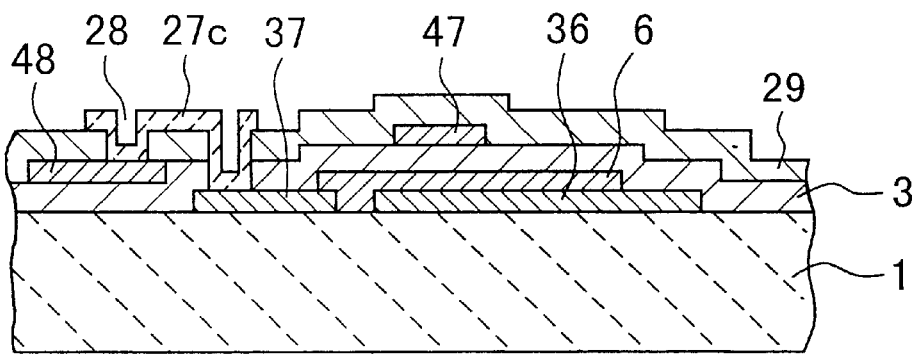
FIG. 15 is a partial sectional view of the TFT array according to the second embodiment of the present invention taken along the line D—D of FIG. 9.
Figure 16:
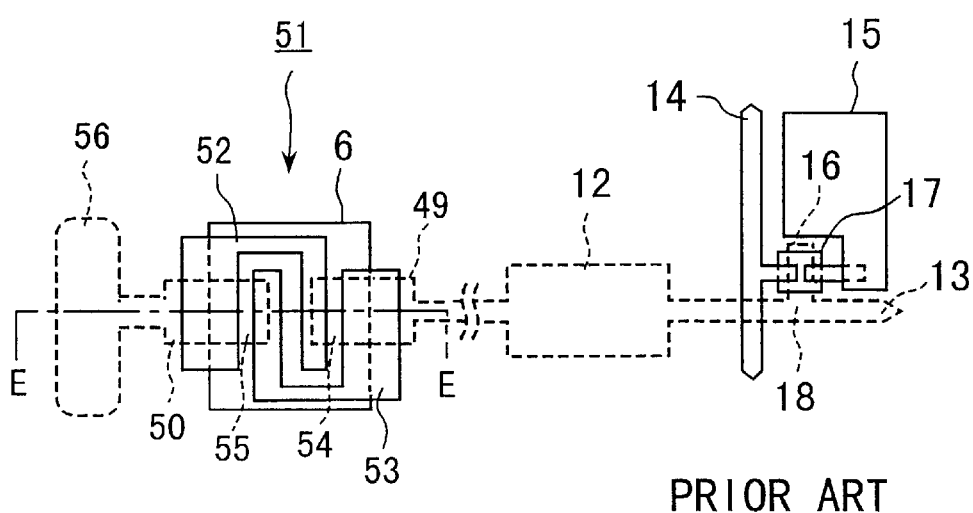
FIG. 16 is a partial plan view illustrating a structure of a conventional TFT array.
Figure 17:
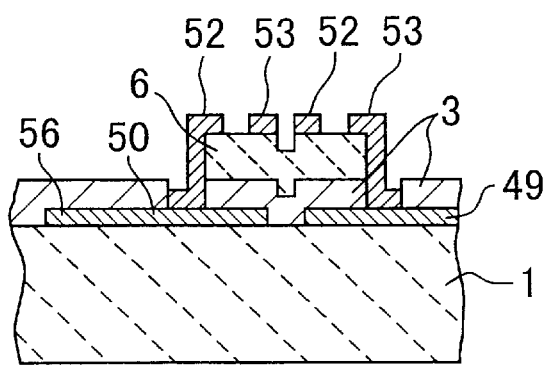
FIG. 17 is a partial sectional view of the conventional TFT array taken along the line E—E of FIG. 16.

Second embodiment will now be described in detail with reference to FIG. 9 through FIG. 15. In this embodiment, the present invention is applied to a thin film transistor array having a top gate type TFT structure. FIG. 9 is a plan view showing a part of a thin film transistor (TFT) array according to the second embodiment of the present invention. In FIG. 9, a structure around a nonlinear element 42 comprising a pair of TFTs 38 and 39 formed at an end portion of a gate wiring 13, around a nonlinear element 43 comprising a pair of TFTs 40 and 41 formed at an end of a signal line 14, and around a TFT for display 18 is illustrated. FIG. 14 is a cross sectional view taken along the line C—C of FIG. 9, and FIG. 15 is a cross sectional view taken along the line D—D of FIG. 9. FIG. 10 through FIG. 13 are plan views showing structures of the thin film transistor of FIG. 9 sequentially in various steps of fabricating process thereof. In particular, FIG. 10 is a plan view showing a structure after patterning of a first conductor film or layer is completed. FIG. 11 is a plan view showing a structure after patterning of a semiconductor film or layer to form semiconductor film regions 6 and 17 is completed. FIG. 12 is a plan view showing a structure after patterning of a second conductor layer is completed. FIG. 13 is a plan view showing a structure after formation of contact holes 28 is finished. Also, the above-mentioned FIG. 9 shows a structure after patterning of a third conductor film is completed.

With reference to FIGS. 9–15, a method for fabricating the thin film transistor array according to the second embodiment will now be explained.

First, a first conductor film is formed on a substrate 1 made of transparent and insulating material, for example, glass and the like by using sputtering and the like. Then, as shown in FIG. 10, the first conductor film is patterned by using photolithography to form a signal line 14, a signal terminal 45, source/drain electrodes of a TFT for display 18, source/drain electrodes 36 and 37 of a nonlinear element 43 on the side of the signal line, source/drain electrodes 34 and 35 of a nonlinear element 42 on the side of the gate wiring, and a common line on the gate wiring side 14, each having a predetermined pattern. Then, a semiconductor film is formed on whole surface of the substrate 1. The semiconductor film is then patterned by using photolithography to form a semiconductor film regions 6 15 and 17 as shown in FIG. 11.

Thereafter, an insulating film 3 is formed on whole surface of the substrate 1 and a second conductor film is formed on the insulating film 3. The second conductor film is patterned by using photolithography to form, as shown in FIG. 12, a gate wiring 13, a gate terminal 44, gate electrodes 31 and 32 of the nonlinear element 42, a gate electrode 16 of the TFT for display 18, and gate electrodes 46 and 47 of the nonlinear element 43, each having a predetermined pattern.

In the next process, a protecting film 29 made of an insulating material is formed on whole surface of the substrate 1. Thereafter, by using photolithography, contact holes 28 are formed at predetermined portions of the protecting film 29 and the insulating film 3 on the first conductor film and the second conductor film, as shown in FIG. 13. Next, a third conductor film is formed on whole surface of the substrate 1. Then, the third conductor film is patterned by using photolithography such that, as shown in FIG. 9, coupling conductor portions 27a, 27b, 27c, 27d and 27e each having a predetermined pattern are formed and such that predetermined portions of the first conductor film and the second conductor film are mutually connected via the contact holes 28. In this case, pixel electrodes 15 each having a predetermined pattern are also formed.

After the above-mentioned processes are performed, a plurality of transparent pixel electrodes 15 disposed in a matrix, and a plurality of TFTs for display 18 each connected to one of the pixel electrodes 15 are formed on the substrate 1 which is made of transparent and insulating material such as glass and the like. On the substrate 1 are also formed a plurality of gate wirings 13 which are formed of the second conductor film and each of which is provided for every row of the pixel electrodes 15 to supply a gate signal to the TFTs for display 18 in a corresponding row, and a plurality of signal lines 14 which are formed of the first conductor film and each of which is provided for every column of the pixel electrodes 15 to supply a data signal to the TFTs for display 18 in a corresponding column.

In addition to the above-mentioned components, at a portion near one end of each of the gate wirings 13, the gate terminal 44, which is used for inputting a predetermined signal from an external circuit, is formed integrally with the corresponding gate wiring 13. Also, at a portion near one end of each of the signal line 14, the signal terminal 45, which is used for inputting a predetermined signal from an external circuit, is formed integrally with the corresponding signal line 14. Further, one end of each of the gate terminals 44 is connected via the nonlinear element 42 comprising a pair of TFTs to the common line on the gate wiring side 33, and one end of each of the signal terminals 45 is connected via the nonlinear element 45 comprising a pair of TFTs to the common line on the signal line side 48.

As shown in the equivalent circuit of FIG. 18, the nonlinear element 42 is electrically equivalent to a circuit formed by two TFTs 38 and 39, wherein gate electrode and drain electrode of each TFT are mutually connected, and wherein source electrode and drain electrode of one of the two TFTs are respectively connected to drain electrode and source electrode of the other one of the two TFTs. Also, the nonlinear element 43 has a structure similar to that of the nonlinear element 42.

In the above-mentioned second embodiment, among a pair of TFTs 38 and 39 forming the nonlinear element 42 at an end of the gate wiring 13, the gate electrode 32 of the TFT 39 on the side of the common line on the gate wiring side 33, is formed as an island like conductor, and the common line on the gate wiring side 33 is formed by the first conductor layer. Also, among a pair of TFTs 40 and 41 forming the nonlinear element 43 at an end of the signal line 14, the source/drain electrode 37 of the TFT 41 on the side of the common line on the signal line side 48, is formed as an island like conductor, and the common line on the signal line side 48 is formed by the second conductor layer.

In the above-mentioned structure, at the vicinity of the nonlinear element 42 formed at an end portion of the gate wiring 13, the gate wiring 13 is formed by the second conductor layer, the gate electrode 32 of the TFT 39 on the side of the common line on the gate wiring side 33 among a pair of TFTs 38 and 39 forming the nonlinear element 42 at an end of the gate wiring 13 is formed as an island like conductor, and the common line on the gate wiring side 33 is formed by the first conductor film. Therefore, during a process of forming the TFT array and before the completion thereof, conductor patterns do not exist which are connected to the common line on the gate wiring side 33 disposed perpendicular to the gate wiring 13 and which are adjacent one ends of the gate wirings 13.

Further, at the vicinity of the nonlinear element 43 formed at an end portion of the signal line 14, the signal line 14 is formed by the first conductor layer, the source/drain electrode 37 of the TFT 41 on the side of the common line on the signal line side 48 among a pair of TFTs 40 and 41 forming the nonlinear element 43 at an end of the signal line 14 is formed as an island like conductor, and the common line on the signal line side 48 is formed by the second conductor film. Therefore, during a process of forming the TFT array and before the completion thereof, conductor patterns do not exist which are connected to the common line on the signal line side 48 disposed perpendicular to the signal line 14 and which are adjacent one ends of the signal line 14.

Therefore, even when a high potential voltage is applied to a particular gate wiring 13 or a particular signal line 14 due to electrification or abnormal discharge during a process of fabricating the TFT array, occurrence of a rush current between the gate wiring 13 and the common line on the gate wiring side 33 or between the signal line 14 and the common line on the signal line side 48 can be avoided. Consequently, disadvantages, such as destruction of the gate wiring 13 or the signal line 14, short circuit due to the melting of the gate wiring 13, the signal line 14, the common line on the gate wiring side 33 or the common line on the signal line side 48 can be decreased. Also, destruction of insulating film, occurrence of abnormal characteristic and the like of the TFT for display 18 connected to the gate wiring 13 or the signal line 14 in which such rush current occurred can be decreased.

With reference to FIG. 9 and FIGS. 10–13 showing process steps of forming the TFT array, the above-mentioned advantages will now be explained in further detail.

With respect to the vicinity of the nonlinear element 43, from the time patterning of the first conductor film is completed as shown in FIG. 10 to the time patterning of the semiconductor layer is completed to form the semiconductor film regions 6 and 17 as shown in FIG. 11, conductor patterns formed by the first conductor layer existing in the vicinity of the nonlinear element 43 are only as follows. That are, the signal line 14, the signal terminal 45 integrally formed with the signal line 14, the source/drain electrode 36 of the TFT 41 among a pair of TFTs 40 and 41 forming the nonlinear element 43, and the source/drain electrode 37 of the other TFT 40 which source/drain electrode 37 is formed at a predetermined space distance from the source/drain electrode 36 and which source/drain electrode 37 is formed as an island like conductor region, i.e., as an isolated conductor region.

That is, in the TFT array according to the present invention, a common line which is formed by the first conductor layer and which extends adjacently to and at right angles with the signal line 14 like that of the prior art (see FIG. 19) does not exist. Therefore, even when a high potential voltage is applied to a particular signal line 14, due to the electrification or abnormal discharge during the process of fabricating the TFTs, no rush current occurs from the signal line 14 to the common line on the signal line side 48. Also, even if a rush current occurred between a particular signal line 14 and a source/drain electrode 37 formed as an island like region, the rush current does not cause a rush current in other signal lines via the common line on the signal line side 48. Thus, according to the present invention, it is possible to prevent the influence of electrostatic damage from extending to other signal lines.

Also, from the time patterning of the second conductor film is completed as shown in FIG. 12 to the time formation of the contact holes 28 is completed as shown in FIG. 13, the source/drain electrode 37 of the TFT 41 among two TFTs forming the nonlinear element 43 is formed as an island like region and is not yet electrically connected to the common line on the signal line side 48. Thus, the common line on the signal line side 48 and the source/drain electrodes 36 which are integrally formed with the respective signal lines 14 are not adjacent to each other. Therefore, even when a high potential voltage is applied to a particular signal line 14, due to the electrification or abnormal discharge during the process of fabricating the TFTs, no rush current occurs between the signal line 14 and the common line on the signal line side 48.

Also, with respect to the vicinity of the nonlinear element 42, at each process after forming the gate wiring 13 as shown in FIGS. 12 and 13, the gate electrode 32 of the TFT 39 among two TFTs forming the nonlinear element 42 is formed as an island like region and is not electrically connected to the common line on the gate wiring side 33. Thus, the common line on the gate wiring side 33 and the gate electrodes 31 which are integrally formed with the respective gate wirings 13 are not adjacent to each other. Therefore, even when a high potential voltage is applied to a particular gate wiring 13, due to the electrification or abnormal discharge during the process of fabricating the TFTs, no rush current occurs between the gate wiring 13 and the common line on the gate wiring side 33.

Especially, in a halfway process until the formation of the TFTs is completed, electrification or abnormal discharge often occurs in a process during which the substrate, on which the TFT array is formed, is exposed to a plasma for a relatively long time, for example, in a film forming process of a gate insulating film or of a semiconductor film by using a CVD method, a dry etching process of a semiconductor film or of a gate insulating film, and the like. In the TFT array according to this embodiment, the gate wirings 13 and the common line on the gate wiring side 33, and the signal lines 14 and the common line on the signal line side 48 can be fabricated without bringing them into close locations during the above-mentioned processes in which electrification or abnormal discharge often occurs, and, therefore, occurrence of the electrostatic damage can be greatly decreased.

After the formation of the TFT array is completed, resistance of each of the nonlinear elements 42 and 43 becomes equal to or greater than 1 giga-ohm when the voltage applied between both terminals thereof is equal to or smaller than 30 volts, and becomes a small value which is considerably smaller than 1 giga-ohm when the voltage applied between both terminals thereof is equal to or larger than 60 volts. To this end, when a high potential voltage is applied to a particular gate wiring 13 or signal line 14 due to electrification and the like, a current caused by the high potential voltage can escape from the gate wiring 13 or the signal line 14 to the common line on the gate wiring side 33 or the common line on the signal line side 48 via the nonlinear elements 42 or 43, respectively. Therefore, occurrence of defects such as the destruction of the gate wiring 13 or the signal line 14 to which the high potential voltage is applied or abnormal characteristic of the TFT for display 18 which is connected to the gate wiring 13 or the signal line 14 can be decreased.

Further, in the test for detecting defects of the TFT array and the like performed after the completion of the fabrication process of the TFTs, when a predetermined voltage, for example, several volts through approximately 20 volts, is applied to the gate wirings 13 and the signal lines 14, the resistance of each of the nonlinear elements 42 and 43 becomes very large. Therefore, leak current flowing through each of the nonlinear elements 42 and 43 becomes very small, so that the test for detecting defects can be done precisely.

As mentioned above, according to the present invention, disadvantages, such as destruction of gate wirings or gate insulating film, occurrence of abnormal characteristic of TFTs for display connected to the gate wirings, and the like, due to electrification, abnormal discharge and the like during the fabrication process of the TFTs can be effectively decreased.

The reasons why such disadvantages can be decreased by the present invention are as follows.

In the above-mentioned first embodiment, among a pair of TFTs forming the nonlinear element provided between the gate wiring and the common line on the gate wiring side, the gate electrode of the TFT on the side of the common line on the gate wiring side is formed as an island like conductor region, that is, an isolated conductor region, and the common line on the gate wiring side is formed by the second conductor layer. Therefore, during a process of forming the TFT array and before the completion of formation of the third conductor film, conductor patterns do not exist which are connected to the common line on the gate wiring side disposed perpendicular to the gate wirings and which are adjacent one ends of the gate wirings in the vicinity of the nonlinear element. Also, among a pair of TFTs forming the nonlinear element provided between the signal line and the common line on the signal line side, the source/drain electrode of the TFT on the side of the common line on the signal line side is formed as an island like conductor, and the common line on the signal line side is formed by the first conductor layer. Therefore, during a process of forming the TFT array and before the completion of formation of the third conductor film, conductor patterns do not exist which are connected to the common line on the signal line side and disposed perpendicular to the signal lines and which are adjacent one ends of the signal lines in the vicinity of the nonlinear element.

In the above-mentioned second embodiment, the gate electrode of the TFT on the side of the common line on the gate wiring side among a pair of TFTs forming the nonlinear element provided between the gate wiring and the common line on the gate wiring side is formed as an island like conductor region, that is, an isolated conductor region, and the common line on the gate wiring side is formed by the first conductor film. Therefore, during a process of forming the TFT array and before the completion of the third conductor film, conductor patterns do not exist which are connected to the common line on the gate wiring side disposed perpendicular to the gate wirings and which are adjacent one ends of the gate wirings. Further, the source/drain electrode of the TFT on the side of the common line on the signal line side among a pair of TFTs forming the nonlinear element provided between the signal line and the common line on the signal line side is formed as an island like conductor, and the common line on the signal line side is formed by the second conductor film. Therefore, during a process of forming the TFT array and before the completion of the third conductor film, conductor patterns do not exist which are connected to the common line on the signal line side and disposed perpendicular to the signal line and which are adjacent one ends of the signal line.

Therefore, even when a high potential voltage is applied to a particular gate wiring or a particular signal line due to electrification or abnormal discharge during a process of fabricating the TFT array, occurrence of a rush current between the gate wiring and the common line on the gate wiring side or between the signal line and the common line on the signal line side can be avoided. Consequently, disadvantages, such as destruction of the gate wiring or the signal line, can be decreased. Also, destruction of insulating film, occurrence of abnormal characteristic and the like of the TFT for display connected to the gate wiring or the signal line in which such rush current occurred can be decreased.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative sense rather than a restrictive sense, and all such modifications are to be included within the scope of the present invention. Therefore, it is intended that this invention encompasses all of the variations and modifications as fall within the scope of the appended claims.

What is claimed is:

1. A method for fabricating a thin film transistor (TFT) array, said TFT array having: a substrate; a plurality of pixel electrodes formed on said substrate and disposed in a matrix having rows and columns; a plurality of TFTs for display each of which is connected to a respective one of said pixel electrodes; a plurality of gate wirings each of which is disposed along every row of said pixel electrodes and each of which is used for supplying a gate signal to said TFTs for display in a corresponding row; a plurality of signal lines each of which is disposed along every column of said pixel electrodes and each of which is used for supplying a data signal to said TFTs for display in a corresponding column; a common conductor line on the gate wiring side formed on said substrate and extending in a direction perpendicular to the direction of extension of said gate wirings; a common conductor line on the signal line side formed on said substrate and extending in a direction perpendicular to the direction of extension of said signal lines; nonlinear elements which are respectively disposed between ends of respective gate wirings and said common conductor line on the gate wiring side and between ends of respective signal lines and said common conductor line on the signal line side, and each of which comprises a plurality of TFTs; said method comprising:

providing a substrate;

forming a first conductor layer on said substrate and patterning said first conductor layer to form at least said plurality of gate wirings, said common conductor line on the signal line side, and each gate electrode of at least one TFT among said plurality of TFTs forming a respective one of said nonlinear elements disposed between ends of respective gate wirings and said common conductor line on the gate wiring side, wherein said each gate electrode is formed as an isolated conductor region;

forming a second conductor layer on said substrate and patterning said second conductor layer to form at least said plurality of signal lines, said common conductor line on the gate wiring side, and each source/drain electrode of at least one TFT among said plurality of TFTs forming a respective one of said nonlinear elements disposed between ends of respective signal lines and said common conductor line on the signal line side, wherein said each source/drain electrode is formed as an isolated conductor region;

forming an insulating layer on said substrate and forming contact holes in said insulating layer; and forming a third conductor layer on said substrate and patterning said third conductor layer to form conductor portions which electrically connect respective ones of said gate electrodes formed by said first conductor layer as an isolated conductor region and said common conductor line on the gate wiring side formed by said second conductor layer via said contact holes, and which also electrically connect respective ones of said source/drain electrodes formed by said second conductor layer as an isolated conductor region and said common conductor line on the signal line side formed by said first conductor layer via said contact holes.

2. A method for fabricating a thin film transistor (TFT) array, said TFT array having: a substrate; a plurality of pixel electrodes formed on said substrate and disposed in a matrix having rows and columns; a plurality of TFTs for display each of which is connected to a respective one of said pixel electrodes; a plurality of gate wirings each of which is disposed along every row of said pixel electrodes and each of which is used for supplying a gate signal to said TFTs for display in a corresponding row; a plurality of signal lines each of which is disposed along every column of said pixel electrodes and each of which is used for supplying a data signal to said TFTs for display in a corresponding column; a common conductor line on the gate wiring side formed on said substrate and extending in a direction perpendicular to the direction of extension of said gate wirings; a common conductor line on the signal line side formed on said substrate and extending in a direction perpendicular to the direction of extension of said signal lines; nonlinear elements which are respectively disposed between ends of respective gate wirings and said common conductor line on the gate wiring side and between ends of respective signal lines and said common conductor line on the signal line side, and each of which comprises a plurality of TFTs; said method comprising:

providing a substrate;

forming a first conductor layer on said substrate and patterning said first conductor layer to form at least said plurality of signal lines, said common conductor line on the gate wiring side, and each source/drain electrode of at least one TFT among said plurality of TFTs forming a respective one of said nonlinear elements disposed between ends of respective signal lines and said common conductor line on the signal line side, wherein said each source/drain electrode is formed as an isolated conductor region;

forming a second conductor layer on said substrate and patterning said second conductor layer to form at least said plurality of gate wirings, said common conductor line on the signal line side, and each gate electrode of at least one TFT among said plurality of TFTs forming a respective one of said nonlinear elements disposed between ends of respective gate wirings and said common conductor line on the gate wiring side, wherein said each gate electrode is formed as an isolated conductor region;

forming an insulating layer on said substrate and forming contact holes in said insulating layer; and forming a third conductor layer on said substrate and patterning said third conductor layer to form conductor portions which electrically connect respective ones of said gate electrodes formed by said second conductor layer as an isolated conductor region and said common conductor line on the gate wiring side formed by said first conductor layer via said contact holes, and which also electrically connect respective ones of said source/drain electrodes formed by said second conductor layer as an isolated conductor region and said common conductor line on the signal line side formed by said second conductor layer via said contact holes.

* * * * *